United States Patent
Lin et al.

(10) Patent No.: US 8,791,001 B2
(45) Date of Patent: Jul. 29, 2014

(54) N2 BASED PLASMA TREATMENT AND ASH FOR HK METAL GATE PROTECTION

(75) Inventors: Yu Chao Lin, Rende Township, Tainan County (TW); Ryan Chia-Jen Chen, Chiayi (TW); Yih-Ann Lin, Jhudong Township, Hsinchu County (TW); Jr Jung Lin, Wurih Township, Taichung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 390 days.

(21) Appl. No.: 12/400,395

(22) Filed: Mar. 9, 2009

(65) Prior Publication Data

US 2010/0062591 A1 Mar. 11, 2010

Related U.S. Application Data

(60) Provisional application No. 61/095,161, filed on Sep. 8, 2008.

(51) Int. Cl.
*H01L 21/335* (2006.01)
*H01L 21/283* (2006.01)

(52) U.S. Cl.
USPC .......................................... 438/585; 438/720

(58) Field of Classification Search
USPC ......... 438/706, 707, 710, 720, 585, 149, 197; 257/E21.19, E21.023
See application file for complete search history.

(56) References Cited

U.S. PATENT DOCUMENTS

| | | | | |
|---|---|---|---|---|
| 5,314,576 A | * | 5/1994 | Kadomura | 216/67 |
| 5,910,453 A | | 6/1999 | Gupta et al. | |
| 6,037,265 A | * | 3/2000 | Mui et al. | 438/719 |
| 6,291,853 B1 | * | 9/2001 | Io | 257/315 |
| 6,492,272 B1 | * | 12/2002 | Okada et al. | 438/690 |
| 6,503,845 B1 | * | 1/2003 | Nallan | 438/714 |
| 6,746,925 B1 | * | 6/2004 | Lin et al. | 438/287 |
| 6,764,898 B1 | * | 7/2004 | En et al. | 438/240 |
| 7,074,664 B1 | * | 7/2006 | White et al. | 438/199 |
| 7,358,594 B1 | * | 4/2008 | Allman et al. | 257/623 |
| 7,566,599 B2 | * | 7/2009 | Divakaruni et al. | 438/151 |
| 2001/0005622 A1 | * | 6/2001 | Kim et al. | 438/592 |
| 2002/0155639 A1 | * | 10/2002 | Ohtake et al. | 438/118 |
| 2003/0003374 A1 | * | 1/2003 | Buie et al. | 430/5 |
| 2003/0207563 A1 | * | 11/2003 | Smith et al. | 438/637 |
| 2004/0007747 A1 | * | 1/2004 | Visokay et al. | 257/391 |

(Continued)

FOREIGN PATENT DOCUMENTS

TV 200826284 6/2008
TW 200707735 2/2007

OTHER PUBLICATIONS

Chinese Patent Office, Office action dated Jul. 2, 2010, Application No. 200910171765.0, 7 pages.

(Continued)

*Primary Examiner* — Michele Fan
(74) *Attorney, Agent, or Firm* — Haynes and Boone, LLP

(57) ABSTRACT

The present disclosure provides a method for making a semiconductor device. The method includes forming a first material layer on substrate; forming a patterned photoresist layer on the first material layer; applying an etching process to the first material layer using the patterned photoresist layer as a mask; and applying a nitrogen-containing plasma to the substrate to remove the patterned photoresist layer.

20 Claims, 6 Drawing Sheets

(56) References Cited

U.S. PATENT DOCUMENTS

| | | | |
|---|---|---|---|
| 2004/0043620 A1* | 3/2004 | Ying et al. | 438/710 |
| 2004/0072081 A1* | 4/2004 | Coleman et al. | 430/5 |
| 2004/0129995 A1* | 7/2004 | Yeo et al. | 257/500 |
| 2004/0192059 A1* | 9/2004 | Sattayapiwat Tang et al. | 438/710 |
| 2004/0209412 A1* | 10/2004 | Arao | 438/197 |
| 2005/0054209 A1* | 3/2005 | Hsu et al. | 438/725 |
| 2005/0095798 A1* | 5/2005 | Cheng et al. | 438/303 |
| 2005/0181590 A1* | 8/2005 | Chiu et al. | 438/595 |
| 2005/0274952 A1* | 12/2005 | Yamazaki et al. | 257/66 |
| 2006/0079093 A1* | 4/2006 | Kim et al. | 438/706 |
| 2007/0026547 A1* | 2/2007 | Kumar et al. | 438/14 |
| 2007/0072403 A1* | 3/2007 | Sakata | 438/585 |
| 2007/0178637 A1* | 8/2007 | Jung et al. | 438/216 |
| 2008/0090342 A1* | 4/2008 | Lee et al. | 438/158 |
| 2008/0210900 A1* | 9/2008 | Wojtczak et al. | 252/79.3 |
| 2008/0280404 A1* | 11/2008 | Chudzik et al. | 438/199 |
| 2008/0303069 A1* | 12/2008 | Fuller et al. | 257/288 |
| 2009/0014813 A1* | 1/2009 | Chao et al. | 257/407 |
| 2009/0017608 A1* | 1/2009 | Tateiwa | 438/589 |
| 2009/0017633 A1* | 1/2009 | Gani et al. | 438/719 |
| 2009/0206416 A1* | 8/2009 | Cheng et al. | 257/369 |
| 2010/0052074 A1* | 3/2010 | Lin et al. | 257/407 |

OTHER PUBLICATIONS

Taiwan Patent Office, Office Action dated Oct. 17, 2012, Application No. 1021105650, 9 pages.

\* cited by examiner

N2 BASED PLASMA TREATMENT AND ASH FOR HK METAL GATE PROTECTION

PRIORITY DATA

This application claims priority to Provisional Application Ser. No. 61/095,161 filed on Sep. 8, 2008, entitled "N2 Based Plasma Treatment and Ash For HK Metal Gate Protection," the entire disclosure of which is incorporated herein by reference.

BACKGROUND

In advanced technology nodes of integrated circuit industry, high k dielectric material and metal are adopted to form a metal gate stack of metal-oxide-semiconductor field-effect transistors (MOSFETs). In a method to form a metal gate stack, a photolithography process is implemented for metal gate patterning. A patterned photoresist layer is formed on the gate material layers, an etching process is then performed to the gate material layers, and then the patterned photoresist layer is removed thereafter by an oxygen ashing process (O2 plasma). However, the O2 plasma removal will cause metal layer oxidation and initial oxide layer re-growth. Furthermore, polymer removal or polysilicon/metal/high k sidewall treatment after gate etching will also cause metal gate oxidation, oxygen penetration to the high k dielectric material layer, and initial oxide layer re-growth.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
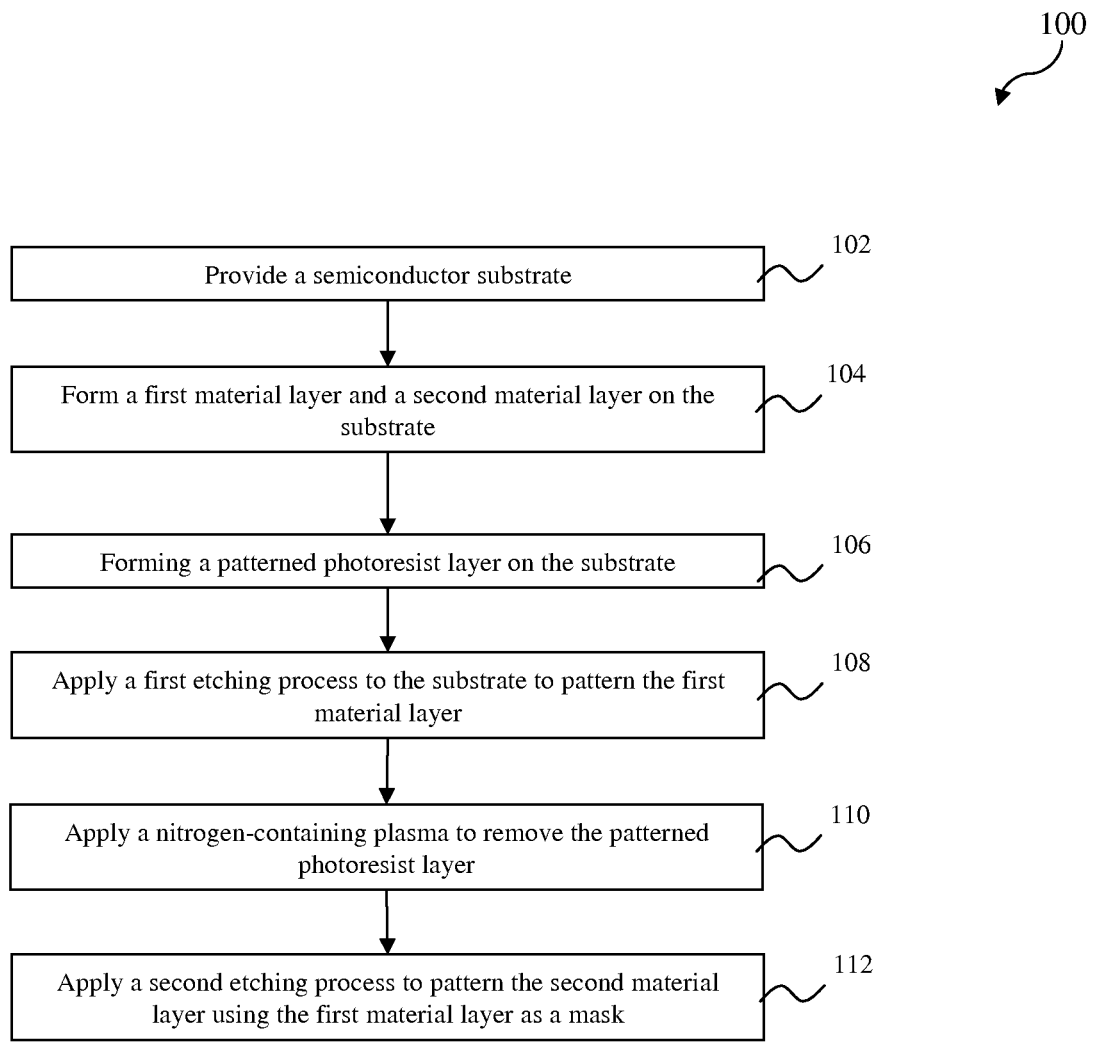
FIG. 1 is a flowchart of a method making a semiconductor device having a metal gate stack in one embodiment constructed according to aspects of the present disclosure.
Figure 2:
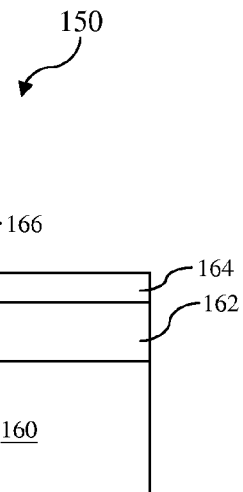
FIGS. 2 through 5 are sectional views of one embodiment of a semiconductor structure having a metal gate stack at various fabrication stages constructed according to aspects of the present disclosure.
Figure 3:
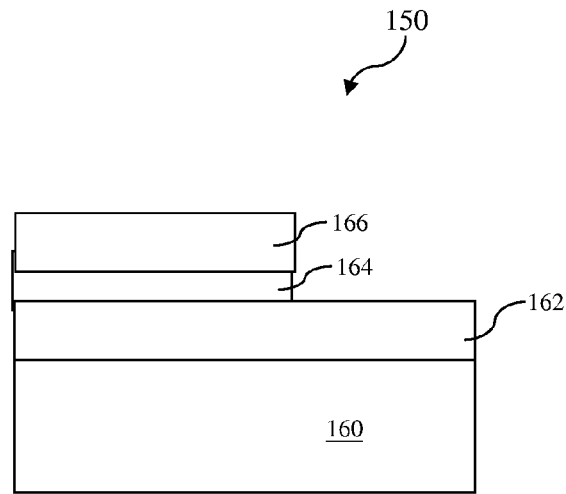
Figure 4:
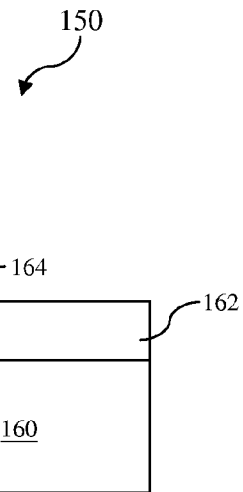
Figure 5:
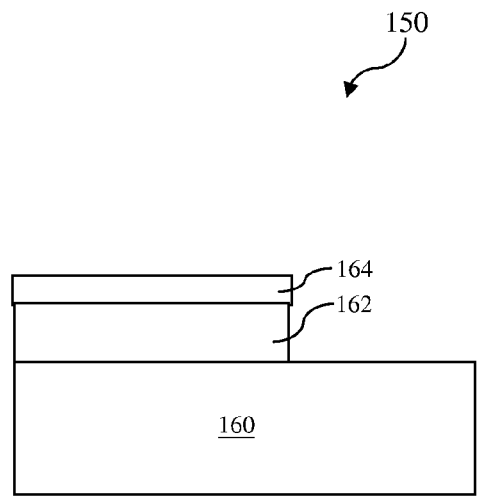

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 making a semiconductor device having a metal gate stack constructed according to aspects of the present disclosure. FIGS. 2 through 5 are sectional views of one embodiment of a semiconductor structure 150 having a metal gate stack at various fabrication stages. The method 100 of making a semiconductor device is described with reference to FIGS. 1 through 5.

The method 100 begins at step 102 by providing a semiconductor substrate 160. The semiconductor substrate 160 includes silicon. Alternatively, the substrate 160 includes germanium, silicon germanium or other suitable semiconductor material, such as diamond, silicon carbide or gallium arsenic. The substrate 160 may further include additional features and/or material layers, such as various isolation features formed in the substrate.

The method 100 proceeds to step 104 by forming a first material layer 162 on the substrate 160 and forming a second material layer 164 on the first material layer. In one embodiment, the first material layer 162 includes a first metal layer. In furtherance of the embodiment, the first metal layer has a thickness of about 50 angstrom in one example. The second material layer includes a second metal layer. The second metal layer may have a thickness of about 100 angstrom in one example.

The method 100 proceeds to step 106 by forming a patterned photoresist layer 166 on the substrate. For example, the patterned photoresist layer is disposed on the second material layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may be alternatively implemented or replaced by other proper methods such as maskless photolithography, electron-beam writing, ion-beam writing, and molecular imprint.

The method 100 proceeds to step 108 by applying a first etching process to the second material layer using the patterned photoresist layer as an etch mask. The etching process can be a dry etch or a wet etch designed to effectively remove the second material layer exposed within the openings of the patterned photoresist layer.

The method 100 proceeds to step 110 by applying a nitrogen-containing plasma to the substrate to remove the patterned photoresist layer. Instead of the oxygen ashing, the nitrogen-containing plasma is used to remove the patterned photoresist to eliminate the oxidation effect to the first and second material layers. The nitrogen-containing plasma includes nitrogen and may further include hydrogen or argon. In one embodiment, a nitrogen gas (N2) is introduced to the processing chamber to generate nitrogen plasma to remove the patterned photoresist layer. The nitrogen gas has a gas flow rate up to about 1000 sccm. The nitrogen gas may be supplied to the processing chamber with a temperature ranging between 0° C. and about 300° C. Alternatively, during the photoresist removal by the nitrogen-containing plasma, the substrate is maintained at a temperature ranging between 0° C. and about 300° C. In another embodiment, a hydrogen gas (H2) is additionally introduced to the processing chamber to generate nitrogen-containing plasma to remove the patterned photoresist layer. The hydrogen gas has a gas flow rate ranging between 0 and about 1000 sccm. The hydrogen gas may be supplied to the processing chamber with a temperature ranging between 0° C. and about 300° C. The nitrogen gas and hydrogen gas ratio is properly tuned for effectively removing the patterned photoresist layer. In another embodiment, an argon gas (Ar) is additionally introduced to the processing chamber to generate nitrogen-containing plasma to remove the patterned photoresist layer. The argon gas has a gas flow rate ranging between 0 and about 1000 sccm. The argon gas may be supplied to the processing chamber with a temperature ranging between 0° C. and about 300° C. The nitrogen gas, argon gas ratio is properly tuned for effectively removing the patterned photoresist layer. In another embodiment, nitrogen, hydrogen and argon are introduced to the processing chamber to remove the patterned photoresist layer. In one example, N2/H2/Ar gas flow ratio is about 100:50:0. In another example, N2/H2/Ar gas flow ratio is about 100:0:50. In another example, N2/H2/Ar gas flow ratio is about 100:20:30. In another example, N2/H2/Ar gas flow ratio is about 20:30:50. the various gases or the substrate may be maintained at a temperature ranging between 0° C. and about 300° C.

The method 100 may proceed to step 112 by applying a second etching process to the first material layer using the second material layer as an etch mask. The second etching process can be a dry etch or a wet etch designed to effectively remove the first material layer exposed within the openings of the second material layer.

In furtherance of the embodiment, the first and second material layers each includes a metal material selected from TiN, MoN, TaC, TiAlN, TaN, Al and W. The disclosed method can be used to pattern the metal gate for a field-effect transistor (FET), such as a metal-oxide-semiconductor FET (MOSFET). In another example, the when a first metal gate feature (n metal) for an n-type MOSFET and a second metal gate feature (p metal) for a p-type MOSFET are separately tuned for proper work functions and therefore the optimized device performances, the disclosed method is used to pattern the n metal for the NMOS and the p metal for the PMOS. In one example, the first material layer is the p metal. In another embodiment, the first material layer is a metal material and the second material layer is polysilicon. In another embodiment, the first material layer is a metal material and the second material layer is a hard mask material layer, such as silicon nitride.

Figure 6:
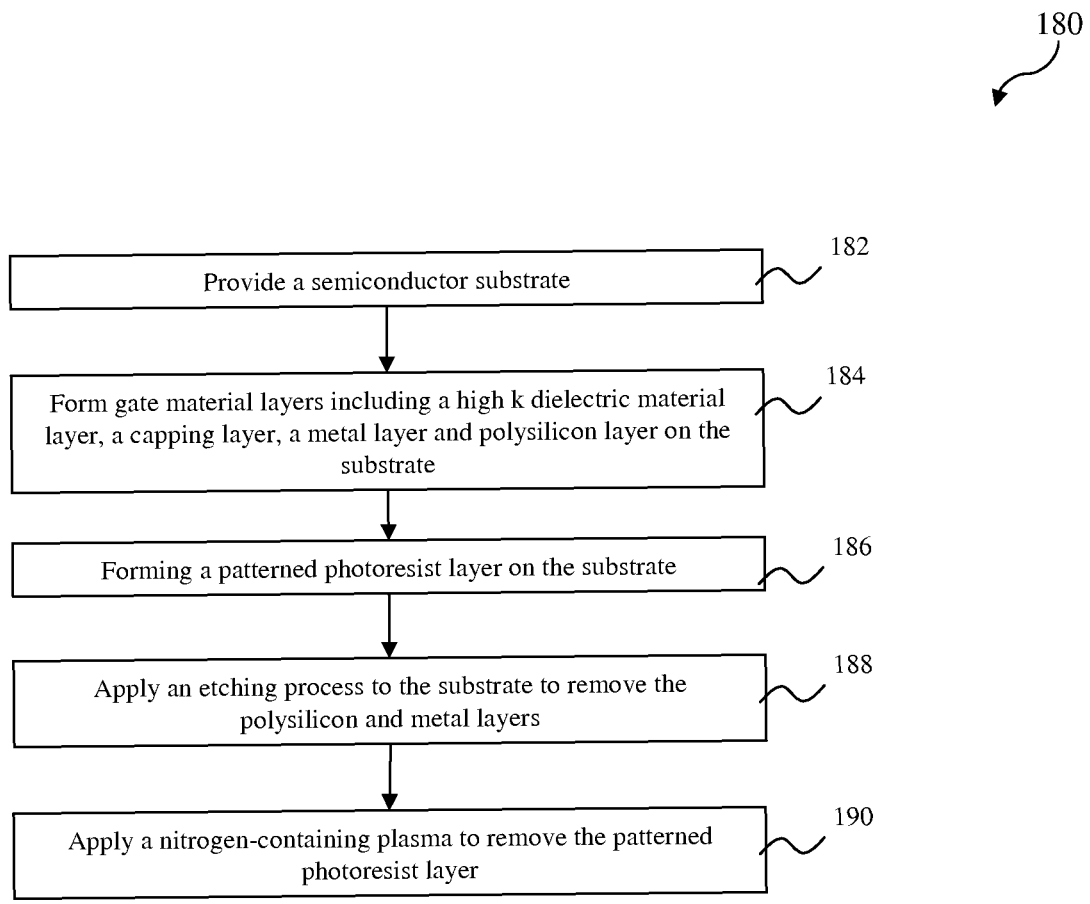
FIG. 6 is a flowchart of a method making a semiconductor device having a metal gate stack in one embodiment constructed according to aspects of the present disclosure in another embodiment.
Figure 7:
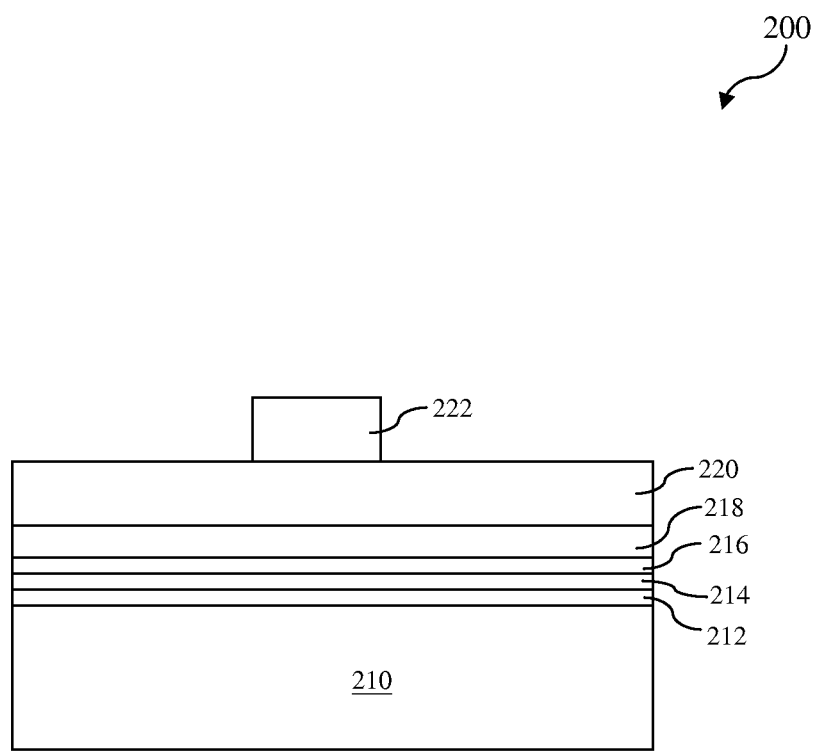
FIGS. 7 through 9 are sectional views of another embodiment of a semiconductor structure having a metal gate stack at various fabrication stages constructed according to aspects of the present disclosure.
Figure 8:
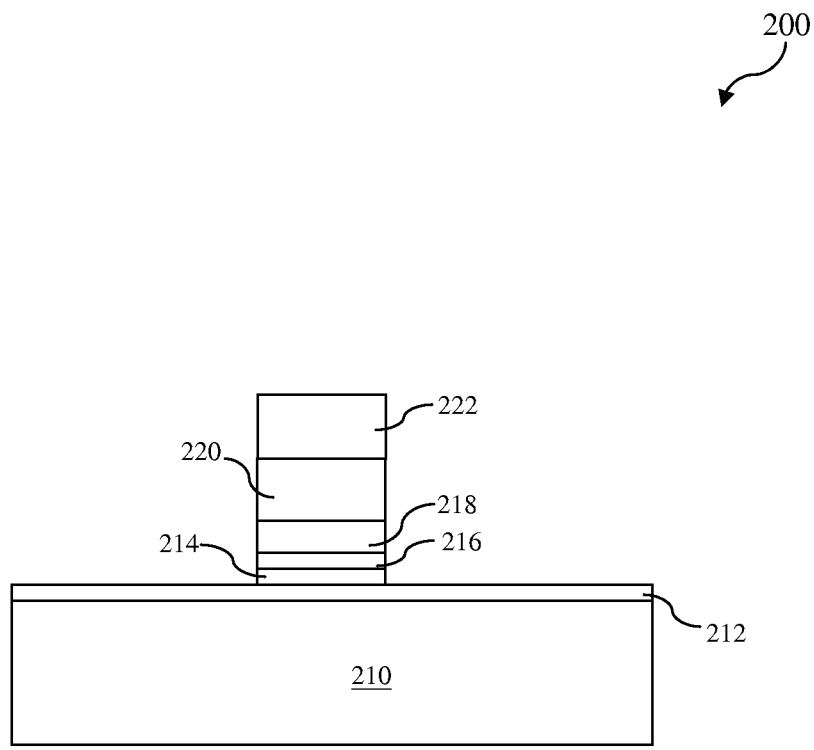
Figure 9:
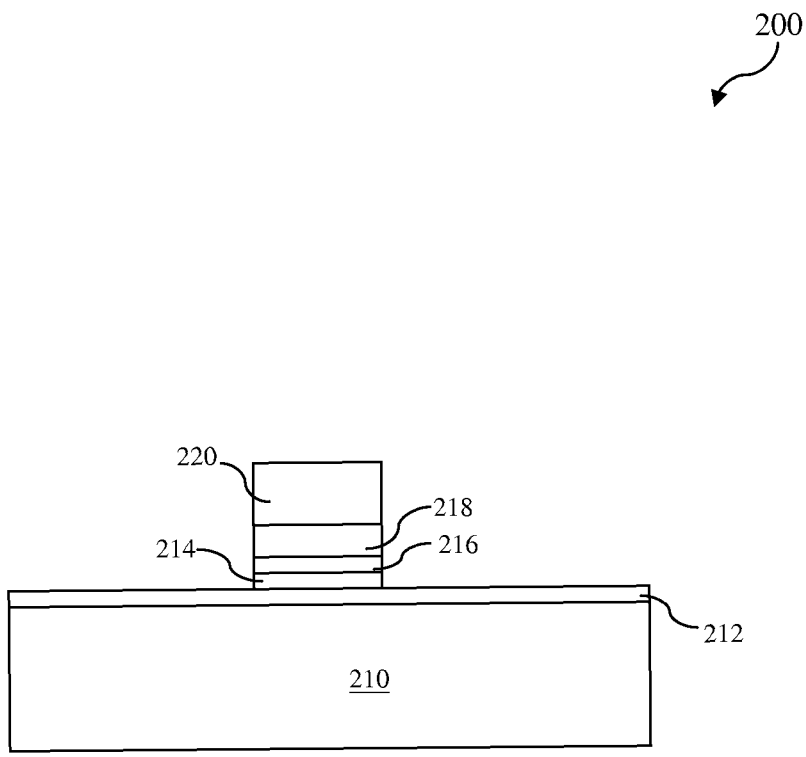

FIG. 6 is a flowchart of another embodiment of a method 180 making a semiconductor device having a metal gate stack constructed according to aspects of the present disclosure. FIGS. 7 through 9 are sectional views of another embodiment of a semiconductor structure 200 having a metal gate stack at various fabrication stages. The method 180 of making a semiconductor device is described with reference to FIGS. 6 through 9.

The method 180 begins at step 182 by providing a semiconductor substrate 210. The semiconductor substrate 210 includes silicon. Alternatively, the substrate 210 includes germanium, silicon germanium or other suitable semiconductor material. In other embodiments, the substrate 210 may use another semiconductor material such as diamond, silicon carbide, gallium arsenic, GaAsP, AlInAs, AlGaAs, GaInP, or other proper combination thereof.

The method 180 proceeds to step 184 by forming various metal-gate-stack material layers on the semiconductor substrate 210. In one embodiment, a high k dielectric material layer 214 is formed on the semiconductor substrate 210. A capping layer 216 may be formed on the high k dielectric material layer 214. A metal gate layer (metal layer) 218 is formed on the capping layer 216. A polysilicon layer 220 is additionally formed on the metal layer 218. An interfacial layer (IL) 212 may be interposed between the semiconductor substrate 210 and the high k dielectric material layer 214.

The high k dielectric material layer 214 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

The metal gate layer 218 is formed by PVD or other suitable process. The metal gate layer includes titanium nitride. In another embodiment, the metal gate layer may include tantalum nitride, molybdenum nitride, tungsten nitride, tungsten, tantalum carbide, tantalum carbide nitride or titanium aluminum nitride.

The capping layer 216 is interposed between the high k dielectric material layer and the metal gate layer. The capping layer includes lanthanum oxide (LaO). The capping layer may alternatively includes other suitable material.

The interfacial layer 212, such as a thin silicon oxide layer, is formed on the silicon substrate 210 before forming the high k dielectric material layer. The thin silicon oxide layer may be formed by atomic layer deposition (ALD) or thermal oxidation.

The method 180 proceeds to step 186 by forming a patterned photoresist layer 222 on the multiple metal-gate-stack layers. The patterned photoresist layer 222 is used as a mask to form metal gates. In this particular case, the patterned mask 222 is formed on the polysilicon layer 220 as illustrated in FIG. 7. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

The method 180 proceeds to step 188 to pattern one or more gate material layers by applying an etching process, using the patterned photoresist layer 222 defining various gate regions and various openings exposing the gate stack material layers to be removed. The polysilicon layer within the openings of the patterned mask are removed by the etching process. In one embodiment, the first etching process utilizes a dry etching process. In one example, the dry etching process implements a fluorine-containing plasma to remove the polysilicon. For example, the etch gas includes CF4. Alternatively, the etch gas may include Cl2, HBr or combinations thereof.

Alternatively, the metal gate layer 218 is patterned as well by the etching process. In an exemplary embodiment illustrated in FIG. 8, the metal gate layer 218, the capping layer 216 and the high k dielectric material layer 214 are patterned as well by the etching process, as illustrated. The etching process to remove the gate material layers may require multiple steps, including various etching steps to separately remove each material layer by a dedicated etching step.

In one embodiment, the metal gate layer is removed by a second etching step. For example, the second etching step utilizes a dry etching process. In one example, the dry etching process implements a fluorine-containing plasma to remove the metal gate layer. Particularly, the first dry etching process uses fluorocarbon plasma. For example, the etch gas includes CF4.

In another embodiment, the high k dielectric material layer 214 is removed by a third etching step. The third etching step is tuned in terms of etching type (dry or wet etch), etchant and etching conditions to effectively remove the high k dielectric material layer. The high k dielectric material layer within the openings of the patterned mask is substantially removed by the third etching step. In one example, the third etching step includes a dry etch. The dry etch at the third etching step may utilize fluorine-containing plasma to remove the high k dielectric material layer. The third etching step may utilize an etch chemistry including at least one of fluorine, chlorine and inert gas to remove the high k dielectric material layer.

Referring to FIG. 9, the method 180 proceeds to step 190 by applying a nitrogen-containing plasma to the substrate to remove the patterned photoresist layer. The nitrogen-containing plasma includes nitrogen and may additionally include hydrogen or argon or both hydrogen/argon. In one embodiment, a nitrogen gas (N2) is introduced to the processing chamber to generate nitrogen plasma to remove the patterned photoresist layer. The nitrogen gas has a gas flow rate up to about 1000 sccm. The nitrogen gas may be supplied to the processing chamber with a temperature ranging between 0° C. and about 300° C. Alternatively, during the photoresist removal by the nitrogen-containing plasma, the substrate is maintained at a temperature ranging between 0° C. and about 300° C. In another embodiment, a hydrogen gas (H2) is additionally introduced to the processing chamber to generate nitrogen-containing plasma to remove the patterned photoresist layer. The hydrogen gas has a gas flow rate ranging between 0 and about 1000 sccm. The hydrogen gas may be supplied to the processing chamber with a temperature ranging between 0° C. and about 300° C. The nitrogen gas and hydrogen gas ratio is properly tuned for effectively removing the patterned photoresist layer. In another embodiment, an argon gas (Ar) is additionally introduced to the processing chamber to generate nitrogen-containing plasma to remove the patterned photoresist layer. The argon gas has a gas flow rate ranging between 0 and about 1000 sccm. The argon gas may be supplied to the processing chamber with a temperature ranging between 0° C. and about 300° C. The nitrogen gas, argon gas ratio is properly tuned for effectively removing the patterned photoresist layer. In another embodiment, nitrogen, hydrogen and argon are introduced to the processing chamber to remove the patterned photoresist layer. In one example, N2/H2/Ar gas flow ratio is about 100:50:0. In another example, N2/H2/Ar gas flow ratio is about 100:0:50. In another example, N2/H2/Ar gas flow ratio is about 100:20:30. In another example, N2/H2/Ar gas flow ratio is about 20:30:50. the various gases or the substrate may be maintained at a temperature ranging between 0° C. and about 300° C. Instead of the oxygen ashing, the nitrogen-containing plasma is used to remove the patterned photoresist to eliminate the oxidation effect to the first and second material layers.

Although not shown, other processing step may present to form various doped regions such as source and drain regions, devices features such as multilayer interconnection (MLI). In one example, a cleaning process is used to remove polymeric residue or other residue formed on the substrate and/or sidewalls of the metal gate stack. The cleaning etching process is designed to effectively remove the polymeric residue and other contamination.

In another example, the light doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structure 150 or 200 serves only as one example of a device within which various aspects of the method 100 or 180 may be implemented. The disclosed semiconductor structure and the method of making the same may be used in other semiconductor devices having a high k and metal gate features, such as strained semiconductor substrate, a hetero-semiconductor device or a stress-free isolation structure.

The present disclosure is not limited to applications in which the semiconductor structure includes a MOS transistor, and may be extended to other integrated circuit having a metal gate stack. For example, the semiconductor structure 150 may include a dynamic random access memory (DRAM) cell, a single electron transistor (SET), and/or other microelectronic devices (collectively referred to herein as microelectronic devices). In another embodiment, the semiconductor structure 150 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one example, the capping layer can be lanthanum oxide or aluminum oxide. In another example, the second material layer of the semiconductor structure 150 may include aluminum or tungsten. In one embodiment, the disclosed method is used to form an n-type metal-oxide-semiconductor field-effect-transistor (NMOSFET). In another embodiment, the disclosed method is used to form a metal gate stack in a gate-first process in which the metal gate stack is formed by the disclosed method and remains in the final structure. In another embodiment, the disclosed method is used to form a metal gate stack in a hybrid process in which the first type metal gate stack (such as NMOS metal gate stack) is formed by the disclosed method and remains in the final structure. The second type of the metal gate stack (such as PMOS metal gate stack) is formed as a dummy gate structure so that source/drain ion implantation processes and annealing processes can be implemented. Thereafter, a portion of the dummy gate stack is removed and the dummy gate trench is refilled with proper materials. For example, the polysilicon layer and metal layer in the PMOS region are removed. Then p metal is refilled and another metal such as copper is further filled in to form PMOS metal gate stack. In another embodiment, the disclosed method is used to form a metal gate stack in a gate-last process in which a dummy metal gate stack is formed by the disclosed method and is then, after the formation of the source and drain features, replaced with final metal layer materials collectively or individually for NMOS and PMOS.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making a semiconductor device. The method includes forming a first material layer on substrate; forming a patterned photoresist layer on the first material layer; applying an etching process to the first material layer using the patterned photoresist layer as a mask; and applying a nitrogen-containing plasma to the substrate to remove the patterned photoresist layer.

In this method, the applying the nitrogen-containing plasma includes introducing a nitrogen gas (N2). The applying nitrogen-containing plasma may further include introducing a hydrogen gas (H2). The applying the nitrogen-containing plasma may further include introducing an argon gas (Ar). In one embodiment, the first material layer includes a metal. The method may further include forming a second material layer interposed between the first material layer and the substrate. The second material layer may include a different metal material. In another embodiment, one of the first material layer and the second material layer includes a material selected from the group consisting of MoN, TaC, TiN, TiAlN, TaN, Al and polysilicon. The applying of the nitrogen-containing plasma to the substrate may include providing the substrate a temperature ranging between about 0° C. and 300° C. The applying of the nitrogen-containing plasma to the substrate may include introducing the nitrogen-containing gas with a temperature ranging between about 0° C. and 300° C. The applying of the etching process may include patterning the first material layer to form a metal gate of a field-effect transistor (FET).

The present disclosure also provides another embodiment of a method for making metal gate stacks of a semiconductor device. The method includes forming a first metal layer on substrate; forming a conductive material layer on the first metal layer; forming a patterned photoresist layer on the conductive material layer, defining openings to expose the metal layer; applying an etching process to the conductive layer and metal layer to remove the metal layer within the openings of the patterned photoresist layer, resulting in a metal gate; and applying a nitrogen-containing plasma to the substrate to remove the patterned photoresist layer.

In this method, the applying of the nitrogen-containing plasma includes introducing a nitrogen gas (N2). The introducing the N2 gas may include supplying N2 with a flow rate up to about 1000 sccm. The applying of the nitrogen-containing plasma may further include introducing a hydrogen gas (H2). The introducing H2 may include supplying H2 with a flow rate up to about 1000 sccm. The applying of the nitrogen-containing plasma may include introducing an argon gas (Ar). The introducing Ar may include supplying Ar with a flow rate up to about 1000 sccm. The applying the nitrogen-containing plasma may include applying the nitrogen-containing plasma to the metal gate to form a protective layer on sidewalls of the metal gate. The method may further include maintaining the substrate at a temperature ranging between about 0° C. and about 300° C. while applying the nitrogen-containing plasma. The conductive layer may include a second metal layer or polysilicon.

The present disclosure also provides another embodiment of a method for making metal gate stacks of a semiconductor device. The method includes forming a high k dielectric material layer on a substrate; forming a metal layer on substrate; forming a polysilicon layer on the metal layer; forming a patterned photoresist layer on the polysilicon layer; applying an etching process to the substrate to remove the polysilicon layer and the metal gate layer using the patterned photoresist layer as a mask; and applying a nitrogen-containing plasma to the substrate to remove the patterned photoresist layer.

The disclosed method may further include forming a capping layer interposed between the high k dielectric material layer and the substrate. The capping layer may include lanthanum oxide (LaO). The metal layer comprises titanium nitride. In another example, the metal layer may include a conductive material selected from the group consisting of tantalum nitride (TaN), tantalum carbide (TaC), molybdenum nitride (MoN) and tungsten nitride (WN). The metal gate stack may be a metal gate structure of a field-effect-transistor (FET). The applying the nitrogen-containing plasma may include introducing nitrogen gas (N2). The applying the nitrogen-containing plasma may include introducing an additional gas selected from the group consisting of hydrogen (H2), argon (Ar) and a combination thereof. The applying the nitrogen-containing plasma may include introducing a nitrogen-containing gas with a temperature ranging between 0° C. and about 300° C.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making metal gate stacks of a semiconductor device comprising:
   forming a first metal layer on a substrate;
   forming a conductive material layer on the first metal layer;
   forming a patterned photoresist layer on the conductive material layer, the patterned photoresist layer defining openings to expose the conductive material layer;
   applying a first etching process to the conductive material layer to remove the conductive material layer within the openings of the patterned photoresist layer to expose the first metal layer within the openings of the patterned photoresist layer;
   applying a second etching process to the first metal layer to remove the first metal layer within the openings of the patterned photoresist layer resulting in a first metal gate, the second etching process being different than the first etching process, wherein applying the second etching process includes implementing a fluorine-containing plasma to remove the first metal layer within the openings of the patterned photoresist layer;
   applying a nitrogen-containing plasma to the substrate to remove the patterned photoresist layer; and
   thereafter removing the first metal layer and conductive layer from the first metal gate.

2. The method of claim 1, wherein the applying of the nitrogen-containing plasma comprises introducing nitrogen gas (N2).

3. The method of claim 2, wherein the applying of the nitrogen-containing plasma further comprises introducing hydrogen gas (H2) and argon gas (Ar).

4. The method of claim 3, wherein the introducing H2 and Ar comprises supplying H2 and Ar with a flow rate of up to about 1000 sccm.

5. The method of claim 3, wherein introducing nitrogen gas ($N_2$), hydrogen gas ($H_2$), and argon gas (Ar) includes introducing at a ratio of $N_2$:$H_2$:Ar selected from the group consisting of 100:20:30 and 20:30:50.

6. The method of claim 1, wherein the applying the nitrogen-containing plasma comprises applying the nitrogen-containing plasma to the metal gate to form a protective layer on sidewalls of the metal gate.

7. The method of claim 1, further comprising maintaining the substrate at a temperature ranging between about 0° C. and about 300° C. while applying the nitrogen-containing plasma.

8. The method of claim 1, wherein after removing the first metal layer and conductive layer from the first metal gate the method further comprises filling the first metal gate with a second metal layer to form a second metal gate.

9. The method of claim 1, further comprising forming a high-k dielectric material on the substrate prior to forming the first metal layer on the substrate.

10. The method of claim 1, wherein the conductive material layer includes polysilicon.

11. The method of claim 1, wherein the first metal layer comprises a material selected from the group consisting of titanium nitride, tantalum nitride, molybdenum nitride, tungsten nitride, tungsten, tantalum carbide, tantalum carbide nitride, and titanium aluminum nitride.

12. The method of claim 1, further comprising forming a capping layer on the substrate prior to forming the first metal layer.

13. The method of claim 12, wherein the capping layer includes lanthanum oxide.

14. A method for making metal gate stacks of a semiconductor device comprising:
   forming a high k dielectric material layer on a substrate;
   forming a metal layer on the substrate;
   forming a polysilicon layer on the metal layer;
   forming a patterned photoresist layer on the polysilicon layer such that the patterned photoresist layer physically contacts the polysilicon layer;
   applying a first etching process to the substrate to remove the polysilicon layer using the patterned photoresist layer as a mask;
   applying a second etching process to the substrate to remove the metal layer using the patterned photoresist layer as the mask, the second etching process being different than the first etching process;
   applying a third etching process to the substrate to remove the high k dielectric material layer using the patterned photoresist layer as the mask, the third etching process being different than the second etching process; and
   applying a nitrogen-containing plasma to the substrate to remove the patterned photoresist layer, and
   wherein the first etching process is a fluorine containing etching process and the third etching process is a fluorine and chlorine containing etching process.

15. The method of claim 14, further comprising forming a capping layer interposed between the high k dielectric material layer and the substrate.

16. The method of claim 15, wherein the capping layer comprises lanthanum oxide (LaO).

17. The method of claim 14, wherein the metal layer comprises a material selected from the group consisting of titanium nitride (TiN), tantalum nitride (TaN), tantalum carbide (TaC), molybdenum nitride (MoN) and tungsten nitride (WN).

18. The method of claim 14, wherein applying the second etching process to the substrate to remove the metal layer using the patterned photoresist layer as the mask includes implementing a fluorine-containing plasma to remove the metal layer.

19. The method of claim 14, wherein the applying of the second etching process to the substrate to remove the metal layer using the patterned photoresist layer as the mask includes patterning the metal layer to form a metal gate, and
   wherein the applying of the nitrogen-containing plasma to the substrate to remove the patterned photoresist layer further includes forming a protective layer on sidewalls of the first metal gate.

20. The method of claim 19, wherein the applying of the nitrogen-containing plasma further comprises introducing nitrogen gas (N), hydrogen gas ($H_2$), and argon gas (Ar).

* * * * *